US008180494B2

(12) United States Patent
Dawson et al.

(10) Patent No.: US 8,180,494 B2
(45) Date of Patent: May 15, 2012

(54) SYSTEM AND METHOD FOR DYNAMICALLY MANAGING BLOWERS AND VENTS

(75) Inventors: Christopher J. Dawson, Arlington, VA (US); Vincenzo V. Diluoffo, Sandy Hook, CT (US); Rick A. Hamilton, II, Charlottesville, VA (US); Michael D. Kendzierski, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 824 days.

(21) Appl. No.: 12/199,370

(22) Filed: Aug. 27, 2008

(65) Prior Publication Data

US 2010/0057259 A1 Mar. 4, 2010

(51) Int. Cl.
*G05B 13/00* (2006.01)
*G05B 15/00* (2006.01)
*G05D 23/00* (2006.01)
*G01F 1/00* (2006.01)
*G01K 1/00* (2006.01)
*G01K 1/08* (2006.01)
*G01R 21/00* (2006.01)
*G01R 21/06* (2006.01)

(52) U.S. Cl. ........ 700/278; 700/276; 700/277; 700/300; 702/45; 702/62; 702/130; 702/132

(58) Field of Classification Search ........................ None
See application file for complete search history.

(56) References Cited

U.S. PATENT DOCUMENTS

| | | | |
|---|---|---|---|
| 6,283,380 B1 * | 9/2001 | Nakanishi et al. | 236/49.3 |
| 6,574,104 B2 * | 6/2003 | Patel et al. | 361/695 |
| 6,694,759 B1 | 2/2004 | Bash et al. | |
| 6,747,872 B1 * | 6/2004 | Patel et al. | 361/695 |
| 6,938,433 B2 * | 9/2005 | Bash et al. | 62/229 |
| 7,031,870 B2 | 4/2006 | Sharma et al. | |
| 7,051,946 B2 * | 5/2006 | Bash et al. | 236/49.3 |
| 7,313,924 B2 | 1/2008 | Bash et al. | |
| 7,463,950 B1 * | 12/2008 | Brey et al. | 700/299 |
| 7,676,280 B1 * | 3/2010 | Bash et al. | 700/17 |
| 7,676,301 B2 * | 3/2010 | Brey et al. | 700/299 |
| 7,885,795 B2 * | 2/2011 | Rasmussen et al. | 703/5 |
| 2003/0158718 A1 | 8/2003 | Nakagawa et al. | |
| 2004/0065097 A1 * | 4/2004 | Bash et al. | 62/180 |
| 2004/0078635 A1 | 4/2004 | Ko | |
| 2004/0141086 A1 | 7/2004 | Mihara | |
| 2004/0206101 A1 | 10/2004 | Bash et al. | |
| 2007/0089446 A1 | 4/2007 | Larson et al. | |
| 2007/0174024 A1 | 7/2007 | Rasmussen et al. | |
| 2010/0085196 A1 * | 4/2010 | Stiver et al. | 340/584 |

OTHER PUBLICATIONS

IPCOM000135036D, Dynamic Thermal Mapping and Trend Analysis As a Control Mechanism for HVAC Systems in Data Centers, IBM, IP.com, Mar. 27, 2006, 3 pages.*

* cited by examiner

*Primary Examiner* — Ramesh Patel
*Assistant Examiner* — Sunray Chang
(74) *Attorney, Agent, or Firm* — John Pivnichny; Roberts Mlotkowski Safran & Cole, P.C.

(57) ABSTRACT

A method implemented in a computer infrastructure having computer executable code tangibly embodied on a computer readable medium being operable to perform a thermal analysis of a data center and overlay the thermal analysis on a map of the data center to provide an overlaid thermal analysis. Additionally, the computer executable code is operable to dynamically control at least one blower and at least one vent in the data center based on the overlaid thermal analysis to direct cool air to a section of the data center in need of cooling.

25 Claims, 4 Drawing Sheets

SYSTEM AND METHOD FOR DYNAMICALLY MANAGING BLOWERS AND VENTS

FIELD OF THE INVENTION

The present invention generally relates to data centers, and more particularly, to a method and system implemented in a computer infrastructure to detect data center conditions and dynamically change the direction of air flow in a data center through the use of blowers or fans which direct air flow through vents which contain physically moveable louvers which are automatically actuated.

BACKGROUND

A traditional data center conventionally includes a plurality of individual computing resources in one open area having four exterior walls. A data center (or other physical space) beneficially has, where possible, an optimized heating and cooling infrastructure. Maintaining data centers at desired temperatures (e.g., set points) helps prevent computer hardware (e.g., IT infrastructure) from overheating and malfunctioning. To this end, many data centers are cooled to relatively low temperatures (e.g., 65° F.) to increase equipment reliability and useful life, and to avoid downtime for repair and/or replacement.

Current climate control systems are largely inefficient. The airflow of a data center is normally regulated by the amount of equipment and heat that is generated by the individual computing resources. Data centers typically have hot spots where IT equipment operates. That is, due to, e.g., the locations of the individual computing resources within the data center, there may be regions of higher temperatures and regions of cooler temperatures in the data center. However, conventional cooling systems cool the entire data center to a temperature well below the set point so that IT equipment operating in the hot spots does not exceed the set point. This increases operational costs and wastes energy.

Moreover, data center hot spots are routinely changing location, depending on which IT equipment is running at any given time. For example, some IT infrastructure in a first area of the data center may run during the day, while other IT infrastructure at a different area of the data center may operate at night. To accommodate such moving hot spot targets, existing systems resort to a sort of 'overkill' by cooling the entire volume of the data center to well below the set point, which increases operational costs. Moreover, with the increasing awareness and desire to operate in a green manner, such excessive use of energy is undesirable.

Furthermore, as, e.g., a rack of computers produce hot air, this hot air will normally be drawn to cooler temperature regions of the data center. This diffusion of the hot air to the cooler temperature regions of the data center adds to the load of cooling air that the heating, ventilation and air conditioning (HVAC) units must produce. Increasing the load on the HVAC units, in turn, increases the costs of operating the data center.

SUMMARY

In a first aspect of the invention, a method implemented in a computer infrastructure having computer executable code tangibly embodied on a computer readable medium is operable to perform a thermal analysis of a data center and overlay the thermal analysis on a map of the data center to provide an overlaid thermal analysis. Additionally, the method comprises dynamically controlling at least one blower and at least one vent in the data center based on the overlaid thermal analysis to direct cool air to a section of the data center in need of cooling.

In another aspect of the invention, a system comprises a thermal analysis tool configured to perform a thermal analysis of a data center and a mapping tool configured to overlay the thermal analysis over a map of the data center to provide an overlaid thermal analysis. Additionally, the system comprises a blower and vent control tool configured to dynamically control a blower and a vent in the data center based on the overlaid thermal analysis.

In an additional aspect of the invention, a computer program product comprising a computer usable medium having readable program code embodied in the medium is provided. The computer program product includes at least one component operable to perform a thermal analysis of a data center by receiving real-time temperature readings from at least one temperature sensor in the data center and at least one of determine average temperatures for regions of the data center based on the real-time temperature readings and determine air flow paths in the data center. Additionally, the at least one component is operable to overlay the thermal analysis on a map of the data center to provide an overlaid thermal analysis. Further, the at least one component is operable to dynamically control at least one blower and at least one vent in the data center based on the overlaid thermal analysis and dynamically control an HVAC system based on the overlaid thermal analysis and a location of the at least one blower and at least one vent.

In a further aspect of the invention, a method comprises providing a computer infrastructure operable to perform a thermal analysis of a data center to identify cooler regions of the data center and hotter regions of the data center and overlay the thermal analysis on a map of the data center to provide an overlaid thermal analysis which correlates the cooler regions of the data center and the hotter regions of the data center with computational resources of the data center. Additionally, the computer infrastructure is operable to dynamically control at least one blower and at least one vent in the data center based on the overlaid thermal analysis and dynamically control an HVAC system based on the overlaid thermal analysis and a location of the at least one blower and at least one vent.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to data centers, and more particularly, to a method and system implemented in a computer infrastructure to detect data center conditions and dynamically change the direction of air flow in a data center through the use of blowers or fans which direct air flow through vents which contain physically moveable louvers which are automatically actuated. The present invention is able to dynamically move a louver of one or more than one individually controllable vent to direct cool airflow towards one or more than one hot spot in the data center without sending cool air to another location in the data center which is not in need of cooling at that time. Additionally, the blower or fan which delivers air to the automatically adjusted louvers may be actuated without actuating other blowers or fans which would otherwise direct cool air to areas which are not in need of cooling. Moreover, the blowers and vents may be used within the data center to, e.g., concentrate cooling capacity and air flow to an area of the data center where a job is scheduled and, e.g., stop or reduce flow of cool air to areas of the data center not being utilized or not in need of cooling.

By implementing the present invention, improved airflow and better managed temperature distributions within the data center may be achieved. Moreover, by dynamically actuating blowers and vents to maximize airflow through the data center to areas in need of cooling, the data center can better utilize its power and cooling resources. With a more dynamic data center, through automatically reconfigurable vents and louvers, the cooler air, for example, may be circulated between parts of the data center that need it, e.g., data center hot spots, and thereby reducing the strain on the HVAC units to produce cooler air for the entire data center. This will allow the data center to maximize cool air within the data center and shield the important computing systems from hot air. This will also protect important computing resources from dangerous hot spots by regulating the hot air within the data center to areas that may be controlled through the use of the dynamic blowers or fans and dynamic vents and/or louvers.

Additionally, implementing the present invention will reduce the amount of energy consumed by the data center HVAC system, thereby increasing the efficiency of the data center. By using a system of dynamically configurable blowers or fans and vents and/or louvers, the energy efficiency of the data center will be improved to reduce the power and strain on cooling the air in certain parts of the data center. Furthermore, the present invention will reduce the costs to cool the data center and may lengthen the mean-time to failure for critical systems that are affected by changes in heat, temperature and humidity.

The present invention provides a system and method to orchestrate the air blowers and vents within a data center in order to optimize the energy efficiency of the data center. The orchestration of the air control systems may be based upon specific attributes of the data center. These attributes may be used to determine the frequency, duration and positioning of these systems in order to reduce energy waste and maximize the energy efficiency within the data center.

In embodiments of the invention, the air blowers and vents within a data center may be orchestrated, controlled or coordinated to route hot air into an adjacent area of the building. This hot air may be used for heating of office space, providing additional heat for basic facility services or just removed to reduce the heat constraints within the data center. The orchestration of the air conditioning units, fans, vents, rack cooling modules, rack blowers and modular chillers may be used to reduce the mixing of hot and cool air flows within the data center. Orchestrating these different cooling systems within the data center may contain the air flows so that additional energy is not wasted cooling a portion of a static data center.

The method and system of the present invention efficiently utilize a data center's air cooling systems to control the air flow and temperatures within a data center environment. Instead of a static system that reacts to the changes in temperature, air flow and humidity within a data center, the various air control systems may be orchestrated to actively moderate the temperature within a data center. For example, instead of reacting to the rising temperature within a section of a data center by moving systems or adding net-new air cooling systems into the data center to fix the problem, in embodiments of the present invention the cooling systems may be intelligently moderated by controlling their usage and directional patterns of their cooling output. For air control systems, the present invention may be employed to direct the air flow in a three-dimensional grid, for example positive (+) or negative (−), up or down, and left or right, or at various angles. For example, blowers or fans may be activated to push air through a vent into a room of the datacenter or towards computing equipment, or to pull or suck air from a room or piece of equipment through a vent. Additionally, air flow may be directed from a vent at an angle, by adjustment of a louver, generally at an angle of up to about 80°, for example from about 10° to about 60°, measured from a plane perpendicular to the face of the vent. The directional control may be adjusted through the use of actuators or other devices configured to move the louvers and/or to indicate a need for movement of the louvers in an automated fashion.

Having the ability to control the usage and directional capabilities of the different air control systems and have them work in an integrated fashion is a great advantage over the traditional capabilities of a static air control system that is regulated via a binary system of on and off. By controlling the direction and orchestration of the air control systems, one may have a greater ability to regulate and control the temperature of the data center than adding net-new equipment.

The system and method of the present invention makes more efficient use of the technology and air control systems that a data center already has versus procuring net-new equipment. The air control systems may exhibit extended lives with more intelligence and therefore potentially reduce the need for net-new air cooling systems. Instead of cooling an entire data center, the present invention may provide a cooling system that only uses blowers and vents to contain and control the hot areas within a data center and limit the amount of cooling systems. By better utilizing the equipment that already exists, the costs to run and cool a data center may be reduced.

In embodiments of the invention the air control systems within a data center are orchestrated, directed or coordinated so that the air flow of the data center is controlled to limit the amount of hot air that must be cooled. The orchestration of these air control systems may include directing their usage and directional capabilities to better cool and control the airflow within a data center. For example, instead of procuring a new air-cooled modular chiller within a data center, the intelligent orchestration of existing air control systems such as directional air conditioners, fans, and vents may be used to control the temperature and air flow versus procuring new equipment. This orchestration at certain intervals may direct the air flow away from the desired parts of the data center to improve energy efficiency.

For example, in accordance with embodiments of the present invention, a thermal analysis of a data center is performed to determine the hot and cold zones within the data center. The environmental and system variables may be taken on predetermined or dynamically determined or variable intervals or schedules via the use of sensors. The environment and system variables may include but are not limited to temperature, humidity, wetness, airflow, carbon emissions, power usage, application priority, job scheduling and application type. Each environmental or system variable may include a time stamp to optimize the process. A given number of environmental and system snap shots may be used as the baseline to determine the optimum workload and job scheduling characteristics. The process may account for the different locations and characteristics for the various air control systems within a data center.

The various air control systems which may be employed include but are not limited to one or more of: 1) HVAC (Heating, Venting, Air Conditioning) systems; 2) module air conditioning units; 3) stand-alone (wall-mounted) air conditioning units; 4) directional air conditioning units; 5) vents; 6) directional vents; 7) fans; 8) directional fans; 9) water cooled racks; 10) rack cooling modules; 11) hot aisle tiles; and 12) cold aisle tiles.

Using the data that was gathered by the various sensors and analyzing the usage and directional capabilities of the air control systems, the system and process may build a technical model to determine the optimum usage and output of the integrated system. For example, to cool a section of the data center, the air control system may direct the cool air as an integrated unit towards the section of the data center that is requiring attention, and may pull warm air to be directed out of the data center. The directional capabilities may be controlled through the use of actuators, such as motors, switches, gears, and other electric, mechanical, or electromechanical devices which are configured to direct the flow of air as needed.

Using the data set gathered from the sensors and updated data center characteristics from the air control systems, the system and method may build a model to determine the optimal orchestration for each of the different air control systems that make up the intelligent movement of the air control systems. The air control systems may be managed to direct the airflow where needed in order to maximize the energy efficiency and reduce the mixture of hot and cool air within the data center.

After the orchestration is performed, a snapshot of the environmental characteristics or parameters of the data center may be gathered. These data center environmental characteristics or parameters may be used in the next intelligent orchestration of the air control systems. Multiple iterations of the model building algorithm may be used to constantly adjust to changing conditions.

System Environment

Figure 1:
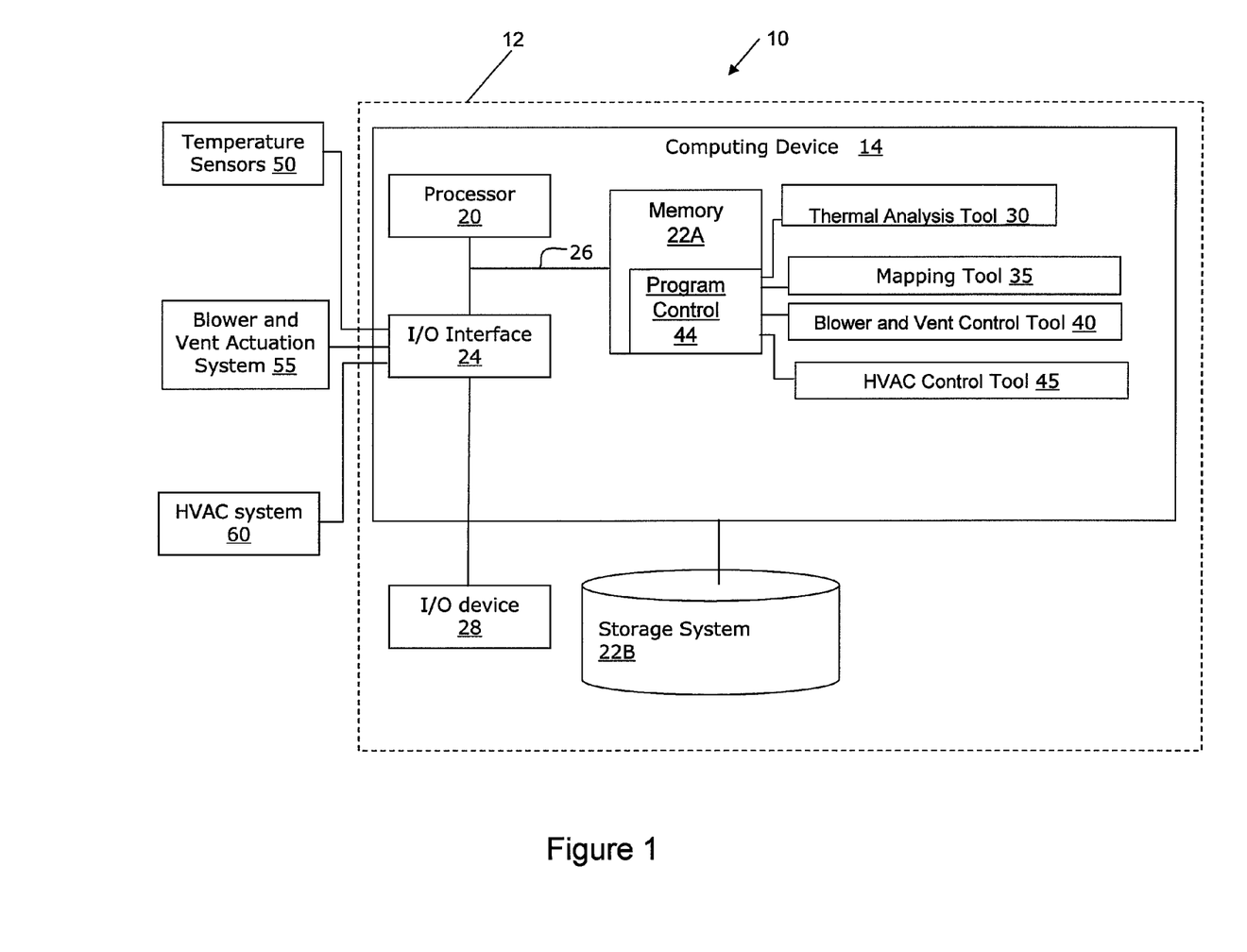
FIG. 1 shows an illustrative environment for implementing steps in accordance with the invention.

FIG. 1 shows an illustrative environment 10 for managing the processes in accordance with the invention. To this extent, the environment 10 includes a computer infrastructure 12 that can perform the processes described herein using a computing device 14. The computing device 14 includes a thermal analysis tool 30, a mapping tool 35, a blower and vent control tool 40 and a heating, ventilation and air conditioning (HVAC) control tool 45. These tools are operable to perform a thermal analysis of a data center, overlay the thermal analysis over a map of the data center, dynamically control at least one blower and at least one vent in the data center based on the overlaid thermal analysis to direct cool air to a section of the data center in need of cooling, and control the HVAC system based on the overlaid thermal analysis, e.g., the processes described herein.

The computing device 14 includes a processor 20, a memory 22A, an input/output (I/O) interface 24, and a bus 26. The memory 22A can include local memory employed during actual execution of program code, bulk storage, and cache memories which provide temporary storage of at least some program code in order to reduce the number of times code must be retrieved from bulk storage during execution.

Further, the computing device 14 is in communication with an external I/O device/resource 28. The I/O device 28 can interact with the computing device 14 or any device that enables the computing device 14 to communicate with one or more other computing devices using any type of communications link. The external I/O device/resource 28 may be keyboards, displays, pointing devices, etc. Additionally, in embodiments, the computing device 14 includes a storage system 22B. Moreover, as shown in FIG. 1 and explained further below, the computing device 14 is in communication with a plurality of environmental sensors, such as temperature sensors 50, a blower and vent actuation system 55 and an HVAC system 60.

The processor 20 executes computer program code (e.g., program control 44) processes on computer media, which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14.

The computing device 14 can comprise any general purpose computing article of manufacture capable of executing computer program code installed thereon (e.g., a personal computer, server, handheld device, etc.). However, it is understood that the computing device 14 is only representative of various possible equivalent computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 12 is only illustrative of various types of computer infrastructures for implementing the invention. For example, in embodiments, the computer infrastructure 12 comprises two or more computing devices (e.g., a server cluster) that communicate over any type of communications link, such as a network, a shared memory, or the like, to perform the processes described herein. Further, while performing the processes described herein, one or more computing devices in the computer infrastructure 12 can communicate with one or more other computing devices external to computer infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the steps of the invention on a subscription, advertising, and/or fee basis. That is, a service provider, such as a Solution Integrator, could offer to perform the processes described herein. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

Thermal Analysis

According to an aspect of the invention, the thermal analysis tool 30 may be used to perform a thermal analysis of a data center. More specifically, a plurality of temperature sensors 50 may be located throughout the data center. In embodiments, the temperature sensors may be, for example, evenly spaced throughout the data center. Additionally, in embodiments, the temperature sensors may be located in known data center hot spots. Moreover, in embodiments, the temperature sensors may be located on the ceiling of the data center, the floor of the data center and/or the walls of the data center (e.g., at differing elevations in the walls of the data center).

The thermal analysis tool 30 may receive real-time temperature readings from the plurality of temperature sensors 50. In embodiments, the thermal analysis tool 30 may determine average temperatures for regions of the data center based on the real-time temperature readings from the plurality of temperature sensors 50. Moreover, based on the real-time temperature readings, the thermal analysis tool 30 can determine a thermal analysis of the data center. For example, the thermal analysis tool 30 can determine regions of the data center that are very hot and regions of the data center that are very cool. Moreover, the thermal analysis tool 30 can determine air flow paths, e.g., hot air flow paths, based on the real-time temperature readings from the plurality of temperature sensors 50. Additionally, the thermal analysis tool 30 may access a job schedule (e.g., stored in storage system 22B), such that the thermal analysis tool 30 is aware of scheduled jobs for the different computing resources of the data center.

According to a further aspect of the invention, the mapping tool 35 may overlay the thermal analysis results obtained from the thermal analysis tool 30 to a map of the data center, e.g., a floor plan view. In embodiments, the map of the data center may include a physical layout of the data center's computing resources, including the locations of computing resources in the data center, as well as an indication as to whether, for example, a portion of computing resources should be maintained in a cool environment and/or a portion of the computing resources can operate in higher temperature environments. Using the floor plan view with the overlaid thermal analysis, the mapping tool 35 can determine those regions of the data center that may benefit from dynamically controlling at least one blower and at least one vent in the data center to direct cool air to a section of the data center in need of cooling and/or to remove hot air from a section of the data center in need of cooling.

Figure 2:
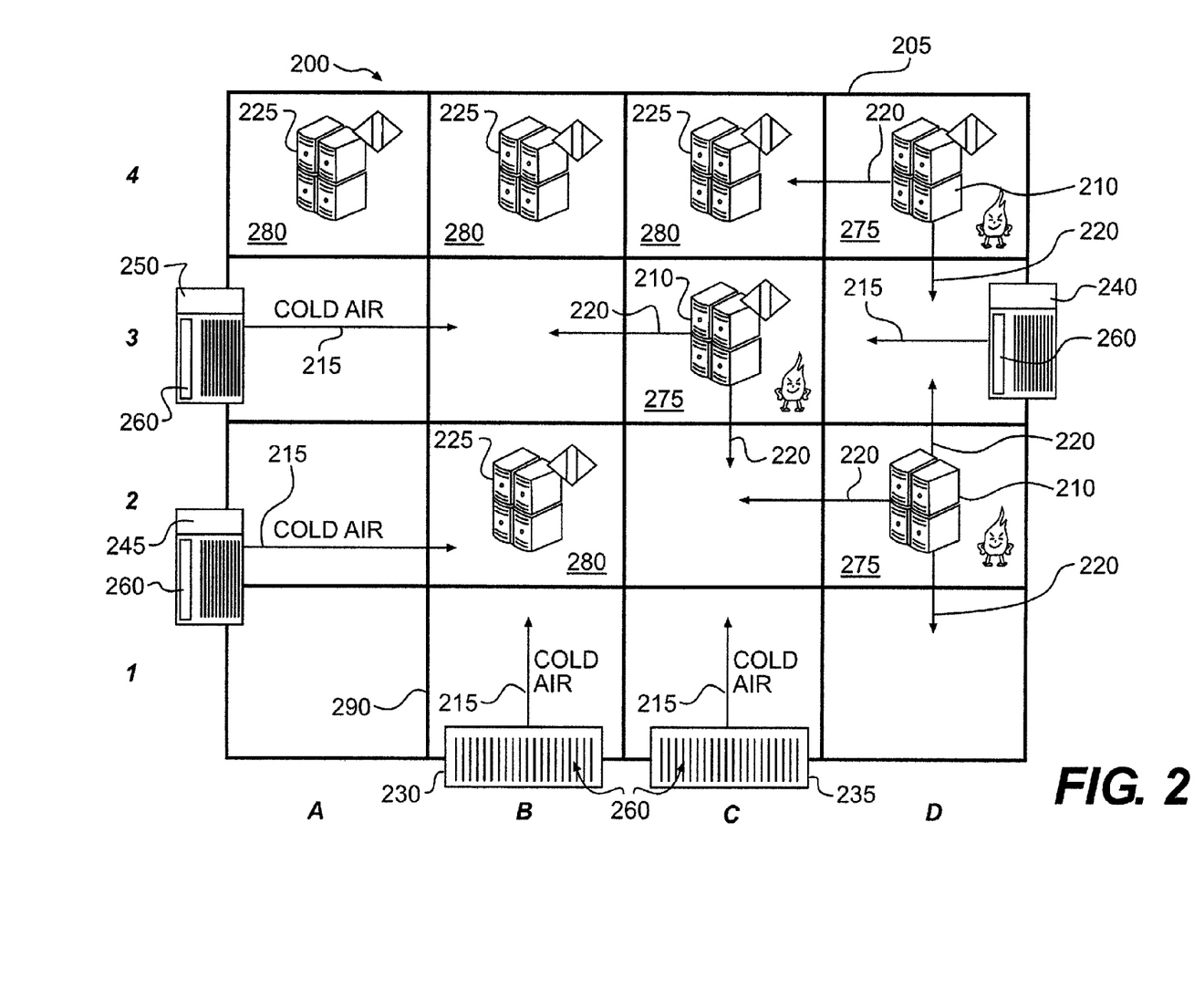
FIG. 2 shows an exemplary thermal analysis of a data center in accordance with the invention.

FIG. 2 shows an exemplary overlaid thermal analysis 200 according to an aspect of the invention. As shown in FIG. 2, a data center 205 contains, for example, computing equipment 210 that is too hot or that should be maintained at a cooler temperature and computing equipment 225 that is sufficiently cool or that may be less sensitive to higher temperatures. Additionally, using the mapping tool 35, FIG. 2 shows a thermal analysis 200 overlaid over a map of the data center 205, such that the overlaid thermal analysis 200 indicates hot air flows 220 and cold air flows 215 within the data center 205. Moreover, as can be determined from the overlaid thermal analysis 200, the computing equipment 210 is generating heat 220 some of which is flowing towards computing equipment 225, which, e.g., along with hot computing equipment 210 should be maintained at cooler temperatures.

It should be understood that, in embodiments, in addition to (or as an alternative to) the mapping tool 35 utilizing a floor plan view of the data center 205 as explained above, the mapping tool 35 may utilize other views of the data center 205, e.g., an elevation plan, in providing the overlaid thermal analysis. Moreover, while the floor plan view may be especially useful for the control of horizontal air flow through vertical vents, such as wall vents, it should be understood that the elevation views may be especially useful for the control of vertical air flow through horizontal vents, such as floor and ceiling vents. That is, the mapping tool 35 may map a thermal analysis over an elevation view, such that cooler or hotter regions (detected by the thermal analysis tool 30) of the data center may identified relative to a vertical axis of the data center. Additionally, the mapping tool 35 may use this overlaid thermal analysis to direct the blower and vent control tool 40 to control a horizontal vent and its associated blower or fan e.g., a ceiling vent and its associated blower, or a floor vent and its associated blower or fan, to, e.g., adjust air flow patterns in the data center by changing the louver position of the vent and/or actuating or turning a blower and cooling unit which is associated with or supplies cold air through the vent.

Data Center Blowers and Vents

According to a further aspect of the invention, the mapping tool 35 may utilize the overlaid thermal analysis 200 to determine one or more vents 230, 235, 240, 245, 250, and associated fans which should be activated, for example due to their closeness to hot regions or grid sections 275 in the data center, such that, for example, cool air is directed to those regions of the data center that should be maintained at a cooler temperature without directing or sending cool air to those regions or grid sections 280 of the data center that, e.g., may require less cooling. In embodiments of the invention, the vents may be wall vents or registers such as schematically shown vents 230, and 235, or vents which are part of an air conditioning, cooling, or wall unit, such as schematically shown vents 240, 245, and 250.

Additionally, according to an aspect of the invention, the mapping tool 35, based on the overlaid thermal analysis, may instruct the blower and vent control tool 40 to dynamically change the position of vent louvers 260 and/or to dynamically change which blowers or fans and/or cooling units are turned on within the data center, to, for example, dynamically change airflow to supply cool air and/or remove hot air in only particular regions of the data center. In embodiments, by, for example, supplying cool air to only computing resources which are in need of cooling, the efficiency of the HVAC units will be improved overall and the temperatures may be better controlled.

Figure 3:
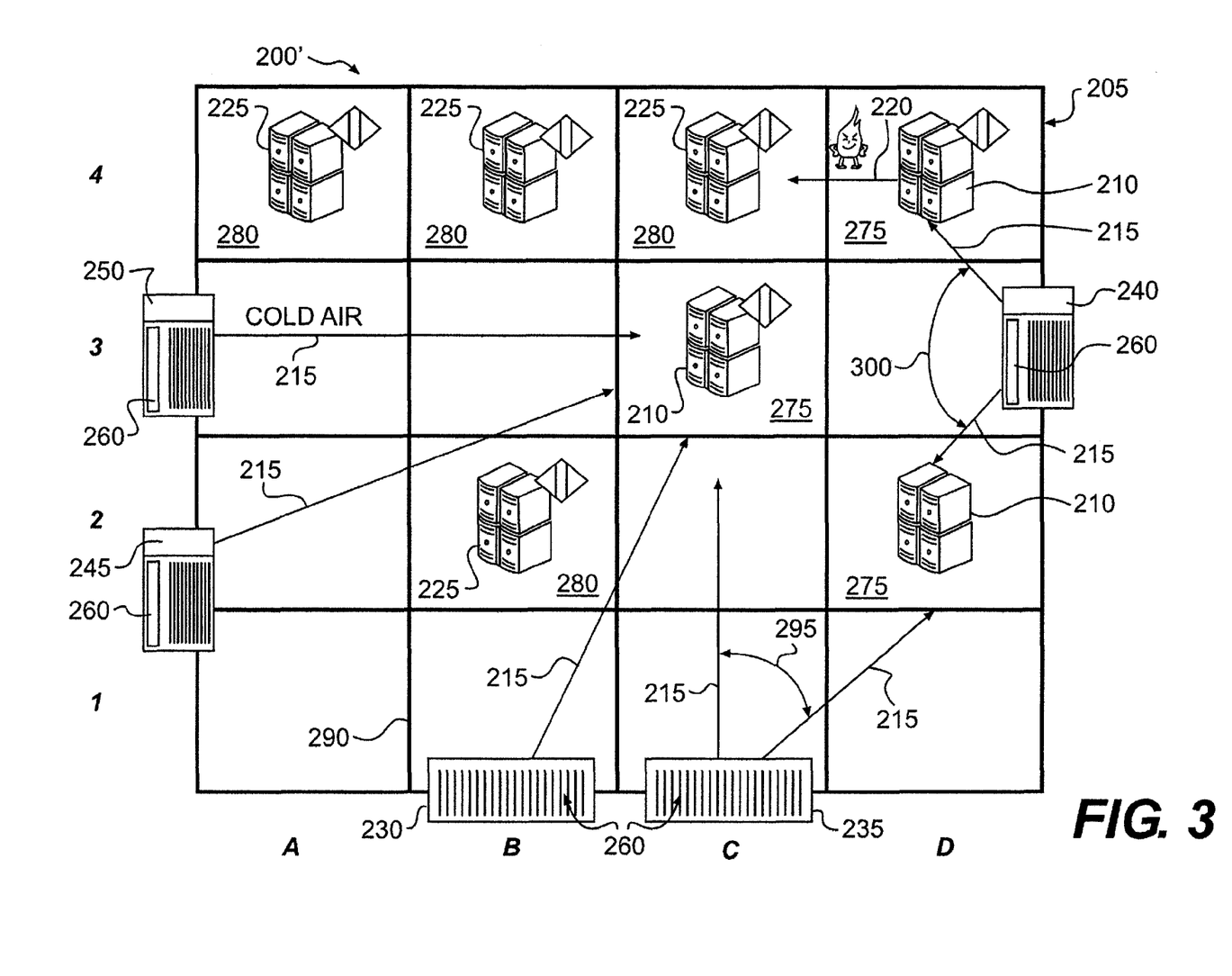
FIG. 3 shows an exemplary updated thermal analysis of a data center in accordance with the present invention.

FIG. 3 shows an exemplary overlaid thermal analysis 200' according to an aspect of the invention. More specifically, FIG. 3 illustrates an overlaid thermal analysis 200' of the data center 205 of FIG. 2 subsequent to the blower and vent control tool 40 positioning louvers 260 of vents 230, 235, 240, 245, 250 to change air stream angles in the data center to dynamically change the data center airflow. As shown in FIG. 3, subsequent to the blower and vent control tool 40 positioning louvers 260 in the data center, the data center airflow has been changed due to the louvers 260.

More specifically, those computing devices 210 which should be maintained at a cooler temperature have been cooled by directing cool air 215 towards them without directing cool air towards computing devices 225 that are less susceptible to higher temperatures or are less in need of cooling. As such, the hot air flow 220 produced by the computing devices 210 is reduced or eliminated within hotter regions or grid section 275 of the data center 205 and does not flow to the cooler regions or grid sections 280 of the data center 205. Moreover, the cold air flow 215 is now directed to the regions of the data center in need of cooling. Thus, as shown in FIG. 3, the blowers and vents may provide a two-fold advantage. First, the hot air flow 220 is reduced or eliminated from the hot regions 275 of the data center 205, such that the hot air flow 220 does not increase temperatures in the cool regions 280 of the data center 205. As the hot air flow 220 does not increase temperatures in the cool regions 280, a load on the HVAC system is reduced. Moreover, a load on the HVAC system is also reduced, as the HVAC system is producing a cold air flow 215 to cool a smaller volume of the data center, e.g., the cool regions 280.

In embodiments, the vents 230, 235, 240, 245, and 250 may each comprise one or a plurality of moveable louvers 260 for dynamically changing the direction of air flow through and/or from the vent so as to direct the air flow in any one or more than one direction, towards any region or grid section 275, 280 or towards any computing equipment, 210, 225. For example, in embodiments of the invention, each vent may include louvers or sets of louvers which may be adjusted to direct air from the vent in one or more than one direction at the same time. In embodiments, some of the louvers of a vent may, for example, be adjusted, upward and some may be adjusted downward, or some may be adjusted towards the left, and some towards the right, or some may be adjusted upwardly and some may be adjusted to the left and/or the right, so that air is directed in more than one direction from each vent. Moreover, in embodiments, for example, the vents may be spaced throughout the data center for activation by the blower and vent control tool 40. Additionally, the vent louvers may be selectively positioned after conducting, e.g., an initial thermal analysis of the data center 205 to establish a baseline thermal analysis of the data center 205.

For example, as exemplified in FIG. 2 and FIG. 3, embodiments of the methods and systems of the present invention provide the ability for HVAC systems (such as module units, stand-alone units, and the like), blowers and vents to be automatically configured to cool specific or selected areas of a data center by directing a stream of cool air. As shown in FIG. 2 and FIG. 3, the data center 205 may be overlaid with a grid type structure 290. For example, the grid structure 290 may have an x-axis reading A, B, C, D and a y-axis reading 1, 2, 3, 4. Therefore cell location A1 is bottom left and D4 is top right.

Environmental sensors may be in place or placed within the data center 205 that measure (but not limited to) temperature and humidity of each cell in the grid. FIG. 2 shows cells D4, C3, D2 are 'hot' cells or hot regions 275. A list of grid coordinates may be prioritized as to which cells need cooling. The list of hot cells may be prioritized based on (but not limited to) based on one or more factors such as the applications currently being processed on servers in each cell, the current rate of change of temperature and/or humidity in each cell, and the risk of overheating of servers at a cell location. For this example, let us say that the prioritized order is D2, C3 then D4 (highest to lowest). For each cell in decreasing priority, an analysis may be performed to determine the closest set of air conditioner units and blowers and vents to each of the prioritized cells. With cell D2 being the highest priority, the blowers and vents are searched for those nearest to cell D2. AC units or vents 230 and 235 at location B1 and C1, respectively are found to be close. Next, the angle of air blowing is accessed to ensure that the stream of air is directed at a specific cell on the grid. For each blower/vent found, the direction of the blowing air may be assessed. For the AC unit in cell C1, the air is currently blowing perpendicular to the wall as shown by the vertical arrow in FIG. 2 and FIG. 3. The angle 295 required to have the air stream 215 hit or be directed to cell D2 is assessed as shown in FIG. 3. In this example, and as shown in FIG. 3, the louvers 260 would be moved towards the right by 45 degrees to provide an angle 295 with the vertical arrow of 45 degrees. Instructions may be sent to switch on the closest AC units and/or vents, for example vents 235 and 240, and have their air stream angle changed to point at the cell D2. This process may be repeated for each of the remaining cells in their prioritized order, e.g. other cell C3, then other cell D4. As shown in FIG. 3 louvers of vent 240 may be changed from their position which provides a horizontal flow of cool air 215 (as shown in FIG. 2) so that the vent 240 provides two streams of cool air at an angle 300 to each other to direct cool air to both cells D2 and D4. In embodiments of the invention, the direction and speed of a vent or blower can be calculated based on aiming cold air at multiple cell locations, using conventional thermodynamic equations and analysis.

In embodiments of the invention, a vent with moveable louvers may replace an existing vent, such as one which does not have adjustable openings. In other embodiments a vent with moveable louvers may be placed, fitted, or attached over part or all of an existing vent, such as one having non-adjustable openings. The added vent may be held or attached to the existing vent in conventional manner with known fastening devices, such as with screws, bolts and nuts, and magnets, amongst other fastening devices. In embodiments, the vents or louvers may be automatically controlled by the blower and vent control tool 40 and deployed using the blower and vent actuation system 55. In embodiments, the blower and vent actuation system 55 may comprise appropriate motors and controls, e.g., servo motors, as would readily be understood by one of ordinary skill in the art. Additionally, in further embodiments, the vents or louvers may be manually actuated, for example, by a data center employee, e.g., changing the direction of louvers or vents by hand.

Moreover, in embodiments, the blower and vent control tool 40 may indicate which vents and/or louvers should be, e.g., altered or moved into position, without automatically positioning the vent or louvers using the blower and vent actuation system or device 55. For example, the vents and/or louvers may include a signaling system, e.g., a light, which indicates to, e.g., a data center employee that a particular vent and/or louver should be deployed or have its direction changed.

Additionally, in embodiments, the blowers, vents, and/or louvers may be, for example, permanently or semi-permanently installed in the data center, such that, e.g., when the blowers or vents are not in use they are stored. However, the invention contemplates that all or a portion of the blowers or fans, or vents or louvers may be preexisting or installed as needed, for example by placing them on pre-installed attachment mechanisms, e.g., hooks, or plates, positioned throughout the data center.

Moreover, the invention contemplates that any number of blowers, fans, vents or louvers, may be used to, e.g., dynamically direct airflow in the data center 205, depending on a number of factors, including the thermal analysis of the data center, the size of the data center, the number of high-temperature sensitive computing resources in the data center, the locations of the high-temperature sensitive computing resources within the data center, the number of non-high-temperature sensitive computing resources, the locations of the non-high-temperature sensitive computing resources within the data center, the real-time load on the data center 205, a job schedule for the data center, and the time of day, amongst other factors.

Moreover, the invention contemplates that any number of blowers, fans, vents or louvers, may be used to, e.g., dynamically direct airflow in the data center 205 so that the at least one blower and the at least one vent at least one of: a) directs cool air towards a hotter section or region of the data center while restricting or preventing cool air flow towards a cooler section or region of the data center; b) directs cool air to a region of the data center where a job is scheduled while restricting or preventing cool air flow towards a region of the data center not being utilized; and c) removes hot air from a hotter section or region of the data center while restricting or preventing removal of air from a cooler section or region of the data center. For example, in accordance with various embodiments of the invention cool air may be directed to a section in need of cooling from at least one vent located nearest the section while restricting or preventing or not directing cool air flow from at least one vent located further or furthest away from the section. Also, in embodiments of the invention, hot air may be removed from a section in need of cooling from at least one vent located nearest the section while restricting or preventing removal of air from at least one vent located further or furthest away from the section.

HVAC Control

According to a further aspect of the invention, the HVAC control tool 45 may control the data center HVAC system 60 based on the determined thermal analysis and, in embodiments, the locations of the blowers and vents. For example, after positioning louvers in the data center, the HVAC control tool 45 may dynamically alter air flow properties of the supplied air to different regions of the data center. More specifically, the HVAC control tool 45 may for example, control the data center HVAC system 60 to dynamically alter air flow properties of the supplied air to different regions of the data center by, selectively increasing or decreasing air flow rates to different regions of the data center, selectively increasing or decreasing air flow temperatures for different regions of the data center and/or selectively turning on or off air flows to different regions of the data center. It should be understood that the data center HVAC system 60 includes duct work, multiple air supply vents and diffusers. Additionally, it should be understood that the HVAC duct work, multiple air supply vents and diffusers may be in the ceiling of the data center, the walls of the data center (e.g., at different elevations on the walls) and/or the floors of the data center (e.g., within a sub floor wiring layer). Moreover, the data center may include temperature sensors 50 throughout the data center. Additionally, as discussed above, in embodiments, the temperature sensors 50 (e.g., thermometers) may be regularly-spaced throughout the data center or randomly-spaced throughout the data center to sense temperature and provide this information to the thermal analysis tool 30.

In embodiments of the invention, the blower and vent control tool 40 may directly change the position of vent louvers or may directly turn on or off particular blowers or fans. In other embodiments, the blower and vent control tool 40 may employ or instruct the HVAC control tool 45 to perform some or all of the changes, such as turning on one or more than one fan or blower which supplies cool air to a vent which has had its louvers moved by the blower and vent control tool 40. In other embodiments of the invention, the blower and vent control tool 40 may position a louver of a vent and turn on the blower associated with the vent, and the HVAC control tool 45 may activate the HVAC control system 60 to lower the temperature of air and/or increase the speed of air supplied by the blower through the vent.

Furthermore, as discussed above, the data center may have computer resources that are to be maintained in a cooler environment and computer resources that can operate in higher temperature environments. Accordingly, the data center may have regions that should be maintained at cooler temperatures (for the computer resources that are to be maintained in a cooler environment) and may have regions that may not need as much cooling (for the computer resources that can operate in higher temperature environments).

Thus, referring to FIG. 3, in embodiments, the HVAC control tool 45 may instruct the HVAC system 60 of the data center, for example, to only supply the cold air flow 215 to the hotter regions 275 of the data center 205, while cutting off a supply of cold air flow to the cooler regions 280. Additionally, in embodiments, the HVAC control tool 45 may instruct the HVAC system 60, for example, to supply the cold air flow 215 to the hotter region 275 of the data center 205, while restricting a supply of cold air flow to the cooler region 280 to, e.g., twenty-five percent of the flow supplied to the hotter region 275. In embodiments, the HVAC control tool 45 may restrict or cut-off flow using the duct work, air supply vents and/or diffusers. For example, the HVAC control tool 45 and/or the blower and vent tool 40 may control the air supply vents, such that the air supply vents may be selectively fully-opened, fully-closed or anywhere between the fully-opened and fully-closed positions.

Additionally, in embodiments, the HVAC system 60 may be capable of concurrently supplying air of differing temperatures to the data center. For example, the HVAC system 60 may comprise a plurality of individually-controllable air conditioning units. Accordingly, the HVAC control tool 45 may, for example, instruct the HVAC system 60 to supply cooling air at different temperatures to the different regions (e.g., as a result of the dynamic placement or positioning of vent louvers) of the data center 205. For example, referring again to FIG. 3, the HVAC control tool 45 may direct the HVAC system 60 to supply air at a temperature of, e.g., 60° F. to the hotter region 275 and supply air at a temperature of, e.g., 80° F. to the cooler region 280.

Dynamic Directing and HVAC Control

The invention contemplates that the temperature distributions may change within the data center dynamically. For example, during the middle of the day, due to, e.g., heat from the sun, conditions may change within the data center. Additionally, computational loads on the computing resources in the data center may change, thus altering, for example, the amount of heat generated by the computing resources, and consequently, a previously determined overlaid thermal analysis.

As such, according to a further aspect of the invention, the thermal analysis tool 30 may perform updates to the thermal analysis and the mapping tool 35 may update the overlaid thermal analysis and may direct the blower and vent control tool 40 to control the blower and vent actuation system 55 and direct the HVAC control tool 45 to control the HVAC system 60 to account for the dynamically changing thermal conditions of the data center. For example, the thermal analysis tool 30 may perform the thermal analysis at a predetermined regular interval, e.g., every hour. It should be understood that the predetermined regular interval may be user configurable.

Additionally, conditions in the data center may trigger an updated thermal analysis by the thermal analysis tool 30, and subsequently, blower and vent and HVAC control adjustments. For example, a temperature sensor 50 in the data center may sense a sudden change in temperature in a particular region of the data center. The thermal analysis tool 30 may detect the sudden change in temperature in a particular region of the data center, and consequently, trigger an update of the thermal analysis, and vent louver positioning and/or HVAC control via the mapping tool 35, the blower and vent control tool 40 and/or the HVAC control tool 45. In embodiments, an updated thermal analysis may be triggered by a change in temperature beyond a predetermined threshold, e.g., five degrees Fahrenheit or ten percent. Moreover, it should be understood that the predetermined threshold may be user-configurable.

Furthermore, a change in load, or an anticipated or scheduled change in load e.g., an increase in load, on the computing devices may trigger an updated thermal analysis. For example, in embodiments, the thermal analysis tool 30 may be configured to additionally detect real-time computational loads on the computing devices of the data center. Thus, according to an aspect of the invention, if the thermal analysis tool 30 detects a computational load increase, e.g., beyond a predetermined threshold, this may trigger an updated thermal analysis. That is, with an increase in computational loads on the computing devices of the data center, the thermal energy produced by the computing device may likewise increase. Thus, an increase in computational loads on the computing devices of the data center may then necessitate, for example, increased cooling in the data center and/or an additional change in position of vent louvers, e.g., to direct cooler air to a portion of the data center containing those computing devices that are now experiencing the increased computational loads.

Moreover, in embodiments, an updated thermal analysis may be manually directed. For example, a data center employee may perceive, e.g., an increase in temperature in a region of the data center. Accordingly, the employee may manually direct an updated thermal analysis and vent louver positioning and/or HVAC control. As a further example, a data center employee may run an unscheduled job on computing devices of the data center. As the job is unscheduled, the thermal analysis tool 30 may initially be unaware of the impending increased computational load. However, the data center employee may know, e.g., based on the size of the impending unscheduled job, that running the job will alter the previous thermal analysis of the data center. Accordingly, the data center employee may manually direct an updated thermal analysis to account for the unscheduled job.

Flow Diagram

Figure 4:
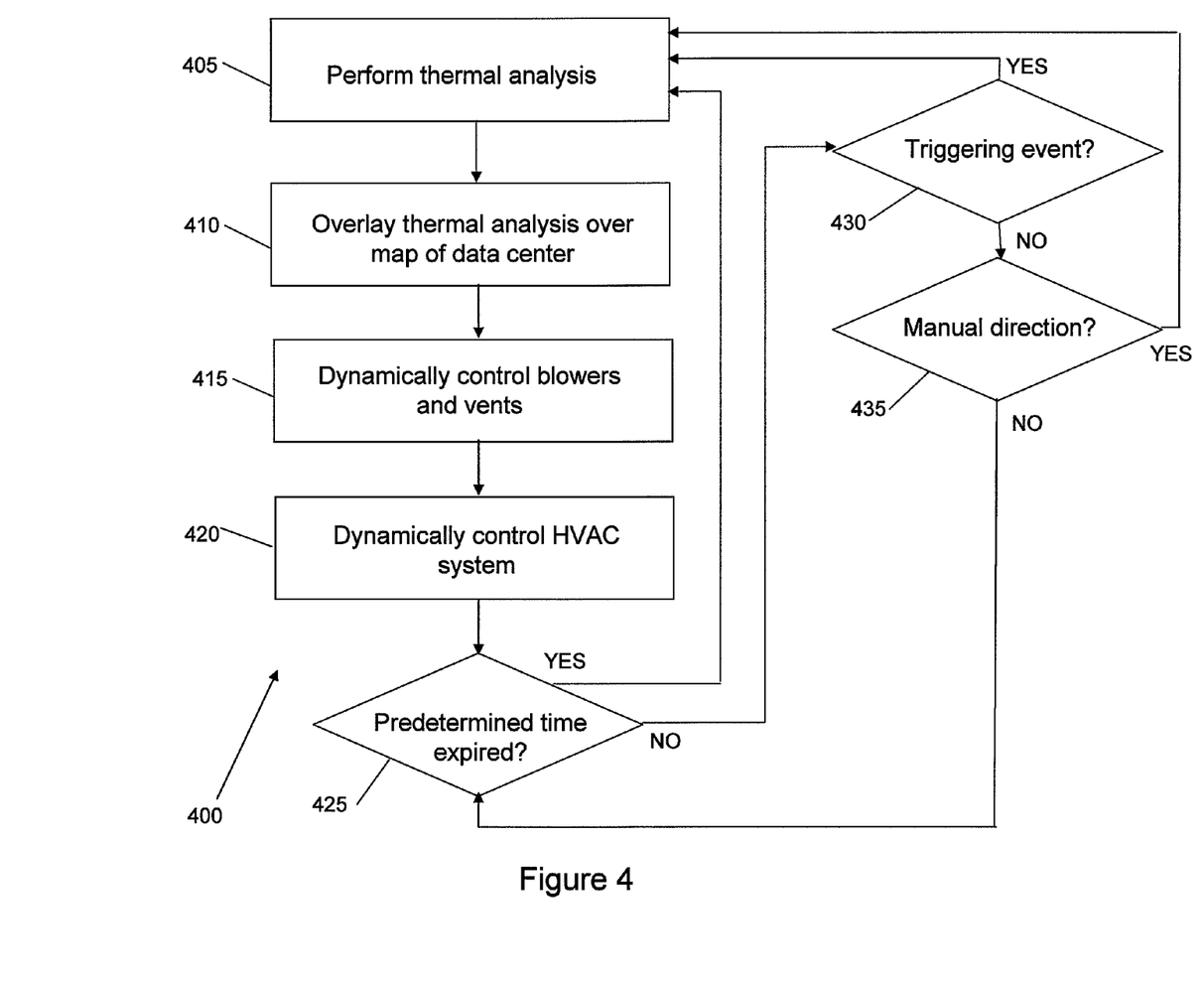
FIG. 4 shows a flow diagram for implementing aspects of the present invention.

FIG. 4 shows an exemplary flow 400 for performing steps of the invention. The steps of the flow diagram described herein may be implemented in the environment of FIG. 1. The flow diagram may equally represent a high-level block diagram of the invention. The steps of the flow diagram may be implemented and executed from either a server, in a client server relationship, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

As shown in FIG. 4, at step 405 the thermal analysis tool performs a thermal analysis of the data center to determine the hot and cold regions of the data center. At step 410, the mapping tool overlays or transposes the thermal analysis over a map or physical layout of the data center's computing resources. At step 415, based on this information about the physical layout (which includes, e.g., information as to which computing resources are to be cooled or maintained in a cool environment and which computing resources do not need to be cooled or are to be operate in a hotter environment, as described above) and data center thermal analysis, the blower and vent control tool can dynamically reposition vent louvers and/or identify, signal, activate or control blowers associated with or supplying air to those vents to direct cool air to the hot spots in need of cooling without sending or without directing cool air to the colder regions of the data center which are not in need of cooling or which require less cooling. At step 420, the HVAC control tool dynamically controls the HVAC system to control, e.g., flow rates and or flow temperatures of the cold air flow.

At step 425, the thermal analysis tool may determine if a predetermined time, e.g., a user-configurable regular interval, has expired. If, at step 425, the thermal analysis tool determines that the predetermined time has expired, then the process continues at step 405, where another thermal analysis is performed. A new or updated thermal analysis can be performed according to the configuration of the blowers and vents or vent louvers of the data center, and modifications to the blowers, vents or vent louvers, and/or the HVAC system may be performed according to the new or updated thermal analysis of the data center.

If, at step 425, the thermal analysis tool determines that the predetermined time has not expired, then at step 430, the thermal analysis tool determines if a triggering event has occurred. If, at step 430, the thermal analysis tool determines that a triggering event has occurred, then the process continues at step 405, where another thermal analysis is performed. If, at step 430, the thermal analysis tool determines that a triggering event has not occurred, then at step 435, the thermal analysis tool determines whether there has been a manual direction for an updated thermal analysis. If, at step 435, the thermal analysis tool determines that a manual direction has occurred, then the process continues at step 405, where another thermal analysis is performed. If, at step 435, the thermal analysis tool determines that a manual direction has not occurred, then the process continues at step 425.

It should be understood, that while the steps have been described as occurring in a particular order, the invention contemplates that the steps may be performed in other orders. For example, step 430 may occur after step 435. Furthermore, the invention contemplates that, in embodiments, steps may be implied or omitted while still remaining true to this invention.

Moreover, while the invention has been described using the thermal analysis tool 30, the mapping tool 35, the blower and vent control tool 40 and the HVAC control tool 45, the invention contemplates that any of the operations performed by the thermal analysis tool 30, the mapping tool 35, the blower and vent control tool 40 and the HVAC control tool 45 may be combined into one as a combination of different tools depending on programming logic, or may be performed manually by a user (e.g., a data center employee). For example, in embodiments, a data center employee may manually control the blowers, fans, vents, or vent louvers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method implemented in a computer infrastructure comprising computer executable code tangibly embodied on a computer readable medium being operable to:
    perform a thermal analysis of a data center;
    overlay the thermal analysis on a map of the data center to provide an overlaid thermal analysis, the map comprising one or more indications of one or more portions of computing resources of the data center that are to be maintained in cool environments and one or more indications of one or more portions of the computing resources that are to operate in higher temperature environments than the cool environments;
    dynamically control at least one blower and at least one vent in the data center based on the overlaid thermal analysis to direct cool air to a section of the data center in need of cooling;
    update the thermal analysis and the overlaid thermal analysis upon the occurrence of a temperature change in the data center beyond a predetermined threshold;
    update the thermal analysis and the overlaid thermal analysis upon the occurrence of a computational resource usage change in the data center beyond a predetermined threshold;
    prioritize the one or more portions of the computing resources that are to operate in the higher temperature environments based on, in each of the one or more portions of the computing resources that are to operate in the higher temperature environments, at least one of:
        one or more applications being processed;
        a rate of change of temperature;
        a rate of change of humidity; and
        a risk of overheating one or more servers; and
    dynamically control the at least one blower and the at least one vent in the data center further based on the prioritizing of the one or more portions of the computing resources that are to operate in the higher temperature environments.

2. The method of claim 1, wherein the computer readable medium is further operable to dynamically control an HVAC system based on the overlaid thermal analysis and a location of the at least one blower and at least one vent.

3. The method of claim 2, wherein the HVAC system is dynamically controllable to alter at least one of an air flow rate and an air flow temperature of at least one of a hotter region of the data center and a cooler region of the data center.

4. The method of claim 1, further comprising updating the thermal analysis and the overlaid thermal analysis after a predetermined time has expired.

5. The method of claim 4, further comprising at least one of dynamically controlling the at least one blower and at least one vent in the data center and dynamically controlling an HVAC system based on the updating.

6. The method of claim 1, wherein the at least one vent comprises at least one actuator and at least one louver, and the actuator automatically moves the louver to direct airflow towards a section of the data center in need of cooling based on the overlaid thermal analysis, and at least one blower is actuated to supply cool air through at least one vent towards the section of the data center in need of cooling based on the overlaid thermal analysis.

7. The method of claim 1, wherein the at least one blower and the at least one vent at least one of:
    directs cool air towards a hotter section or region of the data center while restricting or preventing cool air flow towards a cooler section or region of the data center;
    directs cool air to a region of the data center where a job is scheduled while restricting or preventing cool air flow towards a region of the data center not being utilized; and
    removes hot air from a hotter section or region of the data center while restricting or preventing removal of air from a cooler section or region of the data center.

8. The method of claim 1, further comprising updating the thermal analysis and the overlaid thermal analysis upon the occurrence of a triggering event or a manual direction.

9. The method of claim 8, wherein the triggering event comprises at least one of:
    the temperature change in the data center beyond a predetermined threshold; and
    the computational resource usage change in the data center.

10. The method of claim 1, wherein performing the thermal analysis comprises:
    receiving real-time temperature readings from at least one temperature sensor in the data center; and at least one of:
        determining average temperatures for regions of the data center based on the real-time temperature readings; and
        determining air flow paths in the data center.

11. The method of claim 1, wherein the map of the data center comprises at least one of:
    a physical layout of the computing resources of the data center; and
    a real-time indication of the computing resources that are currently operating.

12. The method of claim 11, wherein the at least one blower and the at least one vent at least one of:
  directs cool air towards a hotter section or region of the data center while restricting or preventing cool air flow towards a cooler section or region of the data center;
  directs cool air to a region of the data center where a job is scheduled while restricting or preventing cool air flow towards a region of the data center not being utilized; and
  removes hot air from a hotter section or region of the data center while restricting or preventing removal of air from a cooler section or region of the data center.

13. The method of claim 11, wherein at least one of:
  cool air is directed to a section in need of cooling from at least one vent located nearest the section while restricting or preventing cool air flow from at least one vent located further away from the section; and
  hot air is removed from a section in need of cooling from at least one vent located nearest the section while restricting or preventing removal of air from at least one vent located further away from the section.

14. The method of claim 1, wherein a service provider at least one of creates, maintains, deploys and supports the computer infrastructure that performs the steps of claim 1.

15. The method of claim 1, wherein steps of claim 1 are provided by a service provider on a subscription, advertising, and/or fee basis.

16. The method of claim 1, wherein the at least one blower and the at least one vent in the data center is dynamically-controlled to direct a first stream of cool air to a first section of the data center in need of cooling and to direct a second stream of cool air to a second section of the data center in need of cooling, the first stream and the second stream directed at an angle to each other.

17. A system, comprising:
  a thermal analysis tool configured to perform a thermal analysis of a data center;
  a mapping tool configured to overlay the thermal analysis over a map of the data center to provide an overlaid thermal analysis; and
  a blower and vent control tool configured to dynamically control at least one blower and at least one vent in the data center based on the overlaid thermal analysis,
  wherein the thermal analysis tool updates the thermal analysis and the mapping tool updates the overlaid thermal analysis, upon the occurrence of a triggering event comprising at least one of:
    a temperature change in the data center beyond a predetermined threshold; and
    a computational resource usage change in the data center,
  wherein the thermal analysis tool prioritizes one or more portions of computing resources of the data center that are to operate in higher temperature environments based on, in each of the one or more portions of the computing resources that are to operate in the higher temperature environments, at least one of:
    one or more applications being processed;
    a rate of change of temperature;
    a rate of change of humidity; and
    a risk of overheating one or more servers; and
  wherein the blower and vent control tool dynamically controls the at least one blower and the at least one vent in the data center further based on the prioritizing of the one or more portions of the computing resources that are to operate in the higher temperature environments.

18. The system of claim 17, further comprising a heating, ventilation and air conditioning (HVAC) control tool configured to control an HVAC system based on the overlaid thermal analysis.

19. The system of claim 18, wherein the HVAC system is dynamically controllable to alter at least one of an air flow rate and an air flow temperature between a hotter region of the data center and a cooler region of the data center.

20. The system of claim 17, wherein:
  the at least one vent comprises at least one actuator and at least one louver, and the actuator is configured to automatically move the louver to direct airflow towards a section of the data center in need of cooling based on the overlaid thermal analysis, and the at least one blower is configured to supply cool air through the at least one vent towards the section of the data center in need of cooling based on the overlaid thermal analysis.

21. The system of claim 17, wherein at least one of:
  cool air is directed to a section in need of cooling from at least one vent located nearest the section while restricting or preventing cool air flow from at least one vent located further away from the section; and
  hot air is removed from a section in need of cooling from at least one vent located nearest the section while restricting or preventing removal of air from at least one vent located further away from the section.

22. The system of claim 17, comprising a computer infrastructure operable to implement the thermal analysis tool, the mapping tool, and the blower and vent control tool, wherein a service provider at least one of creates, maintains, deploys and supports the computer infrastructure.

23. The system of claim 17, wherein the system is operable on software, hardware or a combination of software and hardware.

24. A computer program product comprising a computer usable medium having readable program code embodied in the medium, the computer program product includes at least one component operable to:
  perform a thermal analysis of a data center by receiving real-time temperature readings from at least one temperature sensor in the data center; and at least one of:
    determine average temperatures for regions of the data center based on the real-time temperature readings; and
    determine air flow paths in the data center;
  overlay the thermal analysis on a map of the data center to provide an overlaid thermal analysis, the map comprising an indication of a portion of computing resources of the data center that is to be maintained in a cool environment and an indication of a portion of the computing resources that is to operate in higher temperature environments than the cool environment;
  dynamically control at least one blower and at least one vent in the data center based on the overlaid thermal analysis;
  dynamically control an HVAC system based on the overlaid thermal analysis and a location of the at least one blower and the at least one vent;
  prioritize the portion of the computing resources that is to operate in the higher temperature environments based on, in the portion of the computing resources that is to operate in the higher temperature environments, at least one of:
    one or more applications being processed;
    a rate of change of temperature;
    a rate of change of humidity; and
    a risk of overheating one or more servers; and dynamically control the at least one blower and the at least one vent in the data center further based on the prioritizing of the portion of the computing resources that is to operate in the higher temperature environments.

25. A method comprising:

providing a computer infrastructure operable to:

perform a thermal analysis of a data center to identify cooler regions of the data center and hotter regions of the data center;

overlay the thermal analysis on a map of the data center to provide an overlaid thermal analysis which correlates the cooler regions of the data center and the hotter regions of the data center with computational resources of the data center, the map comprising an indication of a portion of the computing resources that is to be maintained in a cool environment and an indication of a portion of the computing resources that is to operate in higher temperature environments than the cool environment;

dynamically control at least one blower and at least one vent in the data center based on the overlaid thermal analysis;

dynamically control an HVAC system based on the overlaid thermal analysis and a location of the at least one blower and the at least one vent;

prioritize the portion of the computing resources that is to operate in the higher temperature environments based on, in the portion of the computing resources that is to operate in the higher temperature environments, at least one of:

one or more applications being processed;

a rate of change of temperature;

a rate of change of humidity; and a risk of overheating one or more servers; and dynamically control the at least one blower and the at least one vent in the data center further based on the prioritizing of the portion of the computing resources that is to operate in the higher temperature environments.

* * * * *